United States Patent
Ohta

(10) Patent No.: US 10,083,531 B2
(45) Date of Patent: Sep. 25, 2018

(54) PHYSICAL QUANTITY DISTRIBUTION CALCULATION PROGRAM, PHYSICAL QUANTITY DISTRIBUTION CALCULATION METHOD, AND INFORMATION PROCESSING APPARATUS

(71) Applicant: FUJITSU LIMITED, Kawasaki-shi, Kanagawa (JP)

(72) Inventor: Eiji Ohta, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 3 days.

(21) Appl. No.: 15/370,537

(22) Filed: Dec. 6, 2016

(65) Prior Publication Data

US 2017/0186196 A1   Jun. 29, 2017

(30) Foreign Application Priority Data

Dec. 25, 2015   (JP) .................................. 2015-253610

(51) Int. Cl.
  *G06T 11/20*   (2006.01)
  *G06K 9/62*    (2006.01)
  *G01R 29/08*   (2006.01)

(52) U.S. Cl.
  CPC ........ *G06T 11/206* (2013.01); *G01R 29/0814* (2013.01); *G06K 9/6215* (2013.01)

(58) Field of Classification Search
  CPC .. G06T 11/206; G01R 29/0814; G06K 9/6215
  USPC .......................... 345/418, 428, 440, 581, 586
  See application file for complete search history.

(56) References Cited

U.S. PATENT DOCUMENTS

| 2007/0046924 A1* | 3/2007 | Chang ...................... G01C 7/00 356/3.01 |
| 2008/0189088 A1* | 8/2008 | Tani ..................... G06F 17/5018 703/2 |
| 2012/0236014 A1* | 9/2012 | Ohta ........................ G06T 9/00 345/522 |

FOREIGN PATENT DOCUMENTS

| JP | 6-245111 | 9/1994 |
| JP | 8-330905 | 12/1996 |

* cited by examiner

*Primary Examiner* — Xiao Wu
*Assistant Examiner* — Sarah Lhymn
(74) *Attorney, Agent, or Firm* — Staas & Halsely LLP

(57) ABSTRACT

A physical quantity distribution calculation program for visualizing a physical quantity distribution in a target space is disclosed. The program causes the computer to perform processes of: based on positional information on a plurality of grid points and physical quantities obtained respectively at the plurality of grid points by the numerical analysis, grouping the grid points into groups of neighboring grid points having the same physical quantity; and determining the physical quantity to be visualized by each of a plurality of pixels which are fewer than the grid points, the determining process includes; extracting at least one group including at least one of grid points corresponding to the pixel, identifying the group including the largest number of grid points among the extracted groups, and determining that the physical quantity at the grid points belonging to the identified group is the physical quantity to be visualized by the pixel.

5 Claims, 17 Drawing Sheets

FIG. 6

| GRID POINT (di) | 1 | 2 | 3 | 4 | 5 | 6 | 7 | 8 | 9 | 10 | 11 | 12 |
|---|---|---|---|---|---|---|---|---|---|---|---|---|
| CHARACTERISTIC VALUE (Si) | 0 | 5 | 3 | 1 | 1 | 1 | 1 | 3 | 3 | 3 | 1 | 0 |
| DIRECTION (Di) | + | + | + | + | + | + | + | − | + | + | + | + |
| AMOUNT OF CHANGE IN CHARACTERISTIC VALUE (Δi) | 0 | 1 | 2 | −2 | −2 | −2 | −1 | −1 | 1 | 1 | 0 | −1 |

| GRID POINT (di) | 1 | 2 | 3 | 4 | 5 | 6 | 7 | 8 | 9 | 10 | 11 | 12 |
|---|---|---|---|---|---|---|---|---|---|---|---|---|
| CHARACTERISTIC VALUE (Si) | 0 | 5 | 3 | 1 | 1 | 1 | 1 | 3 | 3 | 3 | 1 | 0 |
| DIRECTION (Di) | + | + | + | + | + | + | + | − | + | + | + | + |
| AMOUNT OF CHANGE IN CHARACTERISTIC VALUE (Δi) | 0 | 1 | 2 | −2 | −2 | −2 | −1 | −1 | 1 | 1 | 0 | −1 |
| FEATURE AMOUNT (Gi) | 0 | 1 | 2 | 3 | 3 | 3 | 4 | 5 | 6 | 6 | 7 | 0 |

FIG. 8

| FEATURE AMOUNT (j) | 0 | 1 | 2 | 3 | 4 | 5 | 6 | 7 |
|---|---|---|---|---|---|---|---|---|
| CHARACTERISTIC VALUE (Sj) | 0 | 5 | 3 | 1 | 1 | 3 | 3 | 1 |
| DIRECTION (Dj) | – | + | + | + | + | – | + | + |
| AMOUNT OF CHANGE IN CHARACTERISTIC VALUE (Δj) | – | 1 | 2 | –2 | –1 | –1 | 1 | 0 |
| NUMBER OF GRID POINTS (GPj) | 2 | 1 | 1 | 3 | 1 | 1 | 2 | 1 |

| GRID POINT (di) | 1 | 2 | 3 | 4 | 5 | 6 | 7 | 8 | 9 | 10 | 11 | 12 |
|---|---|---|---|---|---|---|---|---|---|---|---|---|
| GRID-POINT WIDTH (W) | 10 | 10 | 10 | 10 | 10 | 10 | 10 | 10 | 10 | 10 | 10 | 10 |
| PIXEL (Pxi) | 1 | 1 | 1 | 1 | 2 | 2 | 2 | 2 | 3 | 3 | 3 | 3 |

FIG. 10

| PIXEL (k, pxi) | 1 | | | | 2 | | | | 3 | | | |
|---|---|---|---|---|---|---|---|---|---|---|---|---|
| GRID POINT (di) | 1 | 2 | 3 | 4 | 5 | 6 | 7 | 8 | 9 | 10 | 11 | 12 |
| FEATURE AMOUNT (Gi) | 0 | 1 | 2 | 3 | 3 | 3 | 4 | 5 | 6 | 6 | 7 | 0 |
| LARGEST FEATURE AMOUNT ($GMAX_k$) | 3 | | | | 3 | | | | 6 | | | |
| CHARACTERISTIC VALUE DISPLAYED | 1 | | | | 1 | | | | 3 | | | |

FIG. 13

| DISPLAY PIXEL (pk) | 1 | | | | 2 | | | | 3 | | | |
|---|---|---|---|---|---|---|---|---|---|---|---|---|
| DISTRIBUTION POINT (di) | 1 | 2 | 3 | 4 | 5 | 6 | 7 | 8 | 9 | 10 | 11 | 12 |
| CHARACTERISTIC VALUE (Si) | 0 | 5 | 3 | 1 | 1 | 1 | 1 | 3 | 3 | 3 | 1 | 0 |
| LARGEST CHARACTERISTIC VALUE | 5 | | | | 3 | | | | 3 | | | |
| CHARACTERISTIC VALUE OF LARGEST FEATURE AMOUNT | 1 | | | | 1 | | | | 3 | | | |

PHYSICAL QUANTITY DISTRIBUTION CALCULATION PROGRAM, PHYSICAL QUANTITY DISTRIBUTION CALCULATION METHOD, AND INFORMATION PROCESSING APPARATUS

CROSS-REFERENCE TO RELATED APPLICATION

This application is based upon and claims the benefit of priority of the prior Japanese Patent Application No. 2015-253610, filed on Dec. 25, 2015, the entire contents of which are incorporated herein by reference.

FIELD

The embodiment discussed herein is related to a physical quantity distribution calculation program, a physical quantity distribution calculation method, and an information processing apparatus.

BACKGROUND

Use of a super computer, a personal computer (PC) cluster, or other techniques enables numerical calculation of a large-scale model, such as analysis of the entire electronic device including a large scale integration (LSI) circuit, a printed circuit board (PCB), a motor, a mechanism element, and a casing. A result of such calculation, which is, for example, data on the distribution of physical quantities, is massive. The distribution of physical quantities may be visualized by a visualization device. However, the pixels of the visualization device may be fewer than grid points used in the calculation of the physical quantities. In one technique, when there are multiple grid points corresponding to one pixel, for example, the largest one of physical quantities at these grid points is visualized as the physical quantity for the one pixel (see, for example, Japanese Laid-open Patent Publication No. 06-245111).

As another prior art, there is a technique in which a center-point data value among data values in a digital signal waveform is determined as containing spike noise when the difference between the center-point data value and a mid-point between data values before and after the center-point data value is larger than the largest difference among the data values (see, for example, Japanese Laid-open Patent Publication No. 08-330905).

However, the conventional techniques have a problem because when, for example, the largest one of physical quantities at multiple grid points corresponding to one pixel is visualized as the physical quantity for the one pixel, a locally-increased physical quantity may be visualized. For example, when only one of the grid points corresponding to one pixel has a large physical quantity due to locally-generated noise, the physical quantity having a noise component is selected and visualized as the physical quantity for the one pixel.

In one aspect, the embodiment discussed herein aims to provide a physical quantity distribution calculation program, a physical quantity distribution calculation method, and an information processing apparatus capable of removing local noise and visualizing a steady distribution of physical quantities.

SUMMARY

According to an aspect of the invention, a physical quantity distribution calculation program for visualizing a physical quantity distribution in a target space for numerical analysis is disclosed. The program causes the computer to perform processes of: based on positional information on a plurality of grid points and physical quantities obtained respectively at the plurality of grid points by the numerical analysis, grouping the grid points into groups of neighboring grid points having the same physical quantity; and determining the physical quantity to be visualized by each of a plurality of pixels which are fewer than the grid points, the determining process includes; extracting at least one group including at least one of grid points corresponding to the pixel, identifying the group including the largest number of grid points among the extracted groups, and determining that the physical quantity at the grid points belonging to the identified group is the physical quantity to be visualized by the pixel.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating an example of physical-quantity distribution data;

FIG. 7 is a diagram illustrating an example of grouping;

FIG. 8 is a diagram illustrating an example of feature amount data;

FIG. 9 is a diagram illustrating an example of association of each pixel with grid points;

FIG. 10 is a diagram illustrating an example of determination of a characteristic value for each pixel;

FIG. 13 is a diagram illustrating an example where the largest characteristic value is associated with each pixel;

DESCRIPTION OF EMBODIMENT

With reference to the attached drawings, detailed descriptions are given of a physical quantity distribution calculation program, a physical quantity distribution calculation method, and an information processing apparatus according to an embodiment.

Figure 1:
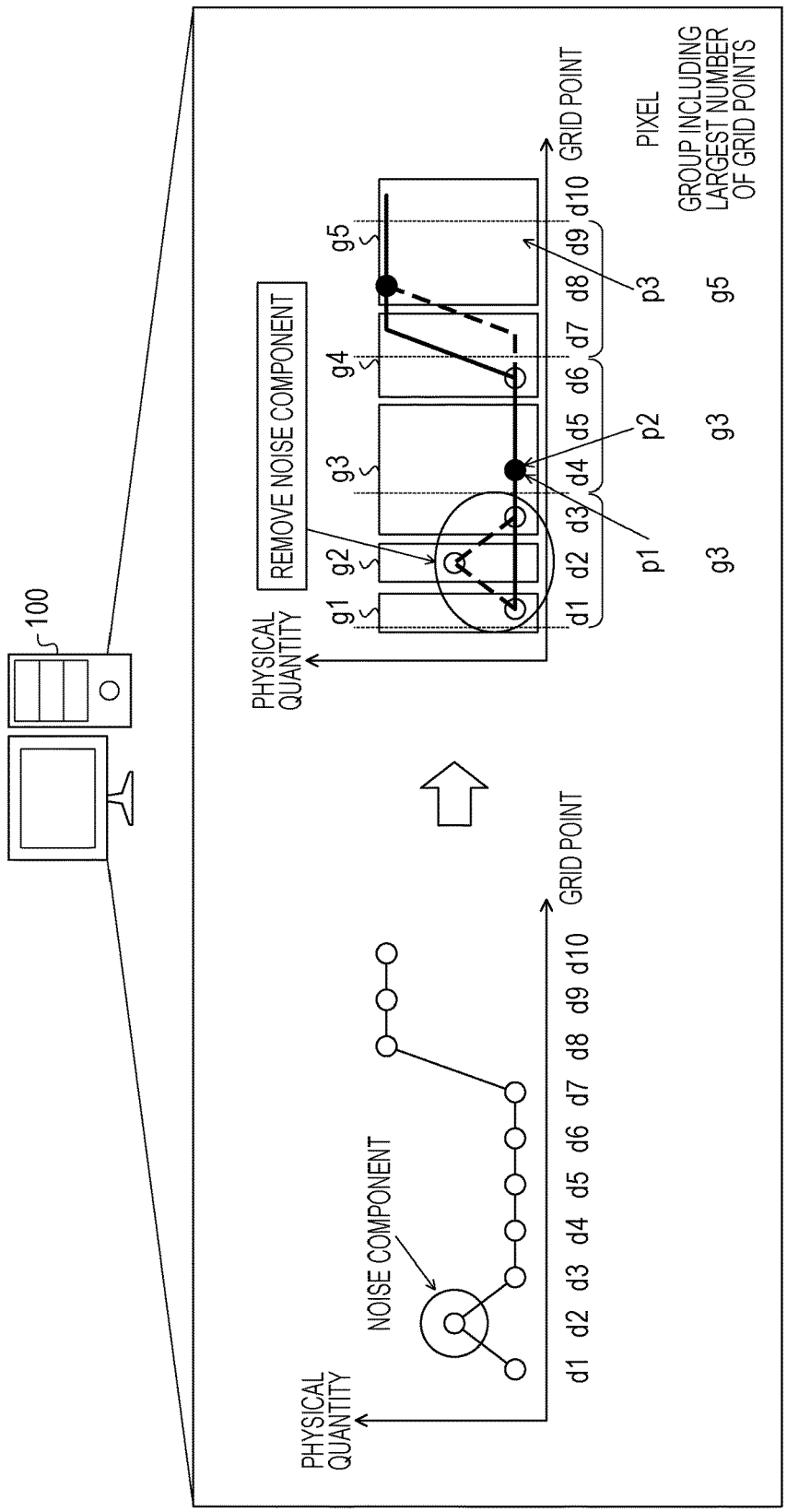
FIG. 1 is a diagram illustrating an example of operation of an information processing apparatus.

FIG. 1 is a diagram illustrating an example of operation of the information processing apparatus. An information processing apparatus 100 is a computer that assists a visualization device in visualization of the distribution of physical quantities in an analysis target space.

The analysis target space may be a simulated space on a computer or an actual space. The analysis target space is, for example, a one-, two-, or three-dimensional space. FIG. 1 depicts an example where a one-dimensional space is sectioned by grid points. Grid points are also called, for example, distribution points. The example in FIG. 1 has grid points d1 to d9. In a case of a two- or three-dimensional space, segmentation of the space by grid points may be called mesh segmentation. In a case of a one-dimensional space, the space is divided into sections by grid points. The grid points are defined in the analysis target space for discretization of the analysis target space.

In analysis using a computer such as structural analysis, electromagnetic field analysis, or fluid analysis, for example, an analysis target space is divided in a net-like form with grid points, and then numerical analysis is performed for each of the grid points, such as solving equations for each of the grid points. Then, the distribution of physical quantities obtained by the numerical analysis is visualized. Discretization may be performed not only on the target space but also on a temporal area. For example, to analyze temporal change, numerical calculation is performed every predetermined period during a period of analysis time.

In the analysis target space, for example, an actual product such as a semiconductor device or an electronic device, a product simulated in a simulated space, or the like may be provided. In electromagnetic analysis, a physical quantity includes, for example, electromagnetic field strength, a direction, and the amount of change in the electromagnetic field strength. The direction mentioned above refers to the direction of an electric field or the charge moving direction. The amount of change in the electromagnetic field strength is the amount of temporal change in the electromagnetic field strength. In structural analysis, a physical quantity includes, for example, stress and the amount of change in the stress. In fluid analysis, a physical quantity is related to the flow, such as pressure and density.

For example, a developer analyzes the characteristics of the electromagnetic field strength distribution, and considers design conditions related to the electromagnetic compatibility (EMC) of an electronic device. This consideration is based on highly-accurate electromagnetic field distribution characteristics both inside and outside the electronic device; thus, data on the distribution of physical quantities is massive.

As described earlier, in recent years, numerical calculation on a large-scale model may be done by use of a super computer, a PC cluster, or other technique. Data on the distribution of physical quantities obtained as a result of the calculation by use of a super computer, a PC cluster, or other technique is massive. Moreover, in recent years, a remote desktop technique or the like may be used, in which a server analyzes physical quantities, generates image information representing an image of the distribution of the physical quantities as a result of the analysis, and transmits the image information to a client terminal device. Then, upon receipt of the image information, the client terminal device displays the image represented by the image information. All the client terminal device does is to display the image. Thus, even if the client terminal device has low calculation capability, large-scale analysis can be conducted using the server having high calculation capability. Results of the calculation, that is, data on the distribution of the physical quantities, are therefore massive.

For this reason, when the distribution of physical quantities is to be visualized by a visualization device, the display resolution of the visualization device may be less than the number of grid points used for the calculation of the physical quantities. The display resolution is, for example, the number of pixels in a displayed image. The visualization device may be specialized for visualization, or may perform numerical analysis, as well. Taking electromagnetic field analysis as an example, in a case of three-dimensional electromagnetic field analysis using the finite-difference time-domain (FDTD) method, which converts Maxwell's equations into differential equations in time and space domains and solves the differential equations, the number of physical quantity data pieces is the number of grid points× the number of times analysis is conducted during analysis time. Assuming that the number of grid points is "2,000×2,000×2,000", the analysis interval is "10 ps", where ps means pico-second, and the analysis time is "1 ns", where ns means nano-second, then the number of pieces of physical quantity data is "2,000×2,000×2,000×1 [ns]/10 [ps]", that is, "800,000,000,000".

Here, it is assumed as an example that the display resolution of the visualization device is "1,024×768", that is, "786, 432 pixels". To visualize, on the visualization device, the distribution of physical quantities on the Z-axis plane of a three-dimensional analysis target space, the number of grid points at each time point for calculation is "2,000×2,000", that is, "4,000,000". Since the ratio of the number of grid points to the number of pixels of the visualization device is "4,000,000 grid points/786,432 pixels", the number of grid points that correspond to one pixel is approximately five.

In a conventional technique, when multiple grid points correspond to one pixel, the largest one of physical quantities at these grid points is visualized as a physical quantity for the one pixel, for example. Instead of the largest value, the smallest value, the intermediate value, the average value, or the like, for example, may be visualized as the physical quantity for the one pixel.

In the conventional technique, however, when, for example, the largest one of the physical quantities at grid points corresponding to one pixel is visualized as the physical quantity for the one pixel, a locally-increased physical quantity may be visualized. For example, when only one of the grid points corresponding to the one pixel has a large physical quantity due to locally-generated noise, the physical quantity having a noise component is selected and visualized as the physical quantity for the one pixel. Consequently, the spatial distribution form of the distribution of physical quantities has a missing part, which may make it difficult to make a correct judgment in the study of the analysis results.

To overcome such a problem, the information processing apparatus 100 according to the present embodiment forms groups of neighboring grid points having the same physical quantity, identifies, in the groups thus formed, a group which includes at least one of grid points corresponding to a visualization pixel and has the largest number of grid points, and determines that the physical quantity at the grid points of the group thus identified is the physical quantity for the pixel. As a result, removal of local noise is achieved to provide visualization of a steady distribution of physical quantities. This hinders the spatial distribution form of the distribution of physical quantities from missing a part, and provides assistance so that a correct judgment may be made in the study of the analysis results.

Based on positional information on grid points defined in a target space and the physical quantities at the grid points obtained by numerical analysis, the information processing apparatus 100 groups the grid points into groups of neighboring grid points having the same physical quantity. Neighboring grid points are considered to have the same physical quantity even when there is error within a threshold between their physical quantities. The physical quantities may be quantized before the grouping.

In the example illustrated in FIG. 1, the target space is a one-dimensional space, and grid points d1 to d10 are defined in the target space at certain intervals. The positional information on each grid point may be represented by, for example, the coordinates of the grid point. Alternatively, the positional information may be represented by, for example, the number of a grid point by which the grid point is uniquely identifiable and the width of a calculation section of the target space defined by the grid point. As depicted in the left hand of FIG. 1, the physical quantity at the grid point d2 is a noise component.

In the example illustrated in FIG. 1, there are ten grid points and three pixels, among which nine grid points d1-d9 correspond to the three pixels. Thus, more than one grid point corresponds to one pixel. Specifically, the grid points d1 to d3 correspond to a pixel p1, the grid points d4 to d6 correspond to a pixel p2, and the grid points d7 to d9 correspond to a pixel p3.

As depicted in the right hand of FIG. 1, a group g1 includes the grid point d1, a group g2 includes the grid point d2, a group g3 includes the grid points d3 to d5, a group g4 includes the grid points d6 and d7, and a group g5 includes the grid points d8 to d10.

For each of multiple pixels, the information processing apparatus 100 extracts, from the groups formed, groups which include at least one of grid points corresponding to the pixel, and identifies a group including the largest number of grid points among the extracted groups. Then, the information processing apparatus 100 determines that the physical quantity at the grid points included in the identified group is the physical quantity to be visualized by the pixel. The multiple pixels are display pixels of the visualization device which are used to visualize and display the physical quantities at the respective grid points obtained by analysis, and are fewer than the grid points.

The groups which include at least one of the grid points d1 to d3 corresponding to the pixel p1 are the groups g1 to g3. Then, the information processing apparatus 100 determines that the physical quantity at a grid point included in the group g3, which has the largest number of grid points among the groups g1 to g3, is to be visualized by the pixel p1. To be more specific, the groups g1 and g2 each include one grid point, and the group g3 includes three grid points. Thus, the value of the grid point d4 of the group g3 is used as the value of the pixel p1.

The groups which include at least one of the grid points d4 to d6 corresponding to the pixel p2 are groups g3 and g4. Then, the information processing apparatus 100 determines that the physical quantity at a grid point included in the group g3, which has the larger number of grid points between the groups g3 and g4, is to be visualized by the pixel p2. To be more specific, the group g3 includes three grid points, and the group g4 includes two grid points. Thus, the value of the grid point d4 of the group g3 is used as the value of the pixel p2.

The groups which include at least one of the grid points d7 to d9 corresponding to the pixel p3 are groups g4 and g5. Then, the information processing apparatus 100 determines that the physical quantity at a grid point included in the group g5, which has the larger number of grid points between the groups g4 and g5, is to be visualized by the pixel p3. To be more specific, the group g4 includes two grid points, and the group g5 includes three grid points. Thus, the value of the grid point d8 of the group g5 is used as the value of the pixel p3.

As a result, the pixel p1 and the pixel p2 have the same physical quantity, and the pixel p3 has the physical quantity represented by the group g5. In this way, the grid point d2, which contains a noise component, is not visualized.

As a result, removal of local noise is achieved to provide visualization of a steady distribution of physical quantities. This hinders the spatial distribution form of the distribution of physical quantities from missing a part, and provides assistance so that a correct judgment may be made in the study of the analysis results.

Figure 2:
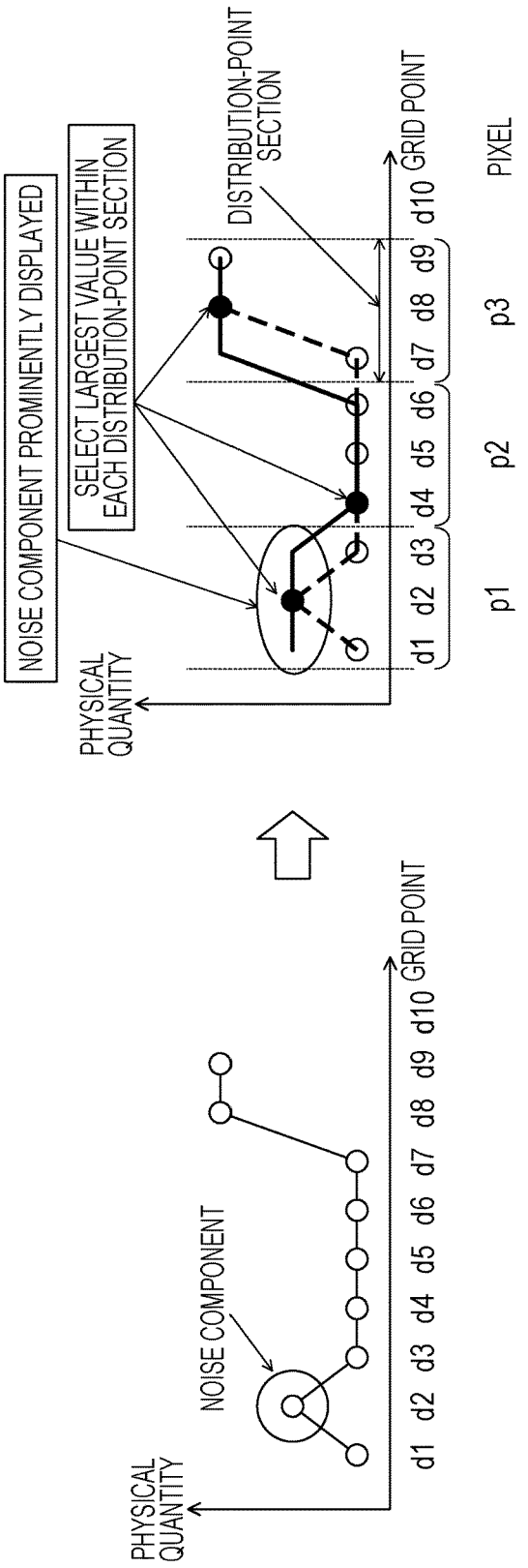
FIG. 2 is a diagram illustrating an example where a noise component is prominently displayed.

FIG. 2 is a diagram illustrating an example where a noise component is prominently displayed. The left hand of FIG. 2 is the same as the left hand of FIG. 1. In the example illustrated in FIG. 2, the grid point d2 contains a noise component. Like in FIG. 1, there are ten grid points and three pixels. Thus, more than one grid point corresponds to one pixel. Specifically, the grid points d1 to d3 correspond to the pixel p1, the grid points d4 to d6 correspond to the pixel p2, and the grid points d7 to d9 correspond to the pixel p3.

As described earlier, the physical quantity at the grid point d2 is visualized because the physical quantity at the grid point d2 is largest. Specifically, the grid point d2 has the largest physical quantity among the grid points d1 to d3 corresponding to the pixel p1. For this reason, the grid point d2 containing a noise component is selected as the physical quantity for the pixel p1 in spite of the fact that the physical quantity at the grid point d2 is the only physical quantity with a noise component. However, since the noise component is thus selected, the noise component is prominently displayed upon visualization. Then, when the noise component is thus prominently displayed, a developer may not be able to conduct smooth study of the distribution of the physical quantities.

Thus, as described using FIG. 1, the information processing apparatus 100 of the present embodiment forms groups of neighboring grid points having the same physical quantity, extracts groups which include at least one of grid points corresponding to the pixel, identifies a group including the largest number of grid points among the extracted groups, and determines that the physical quantity at the grid points included in the identified group is the physical quantity for the pixel. As a result, removal of local noise is achieved to provide visualization of a steady distribution of physical quantities. This hinders the spatial distribution form of the distribution of physical quantities from missing a part, and provides assistance so that a correct judgment may be made in the study of the analysis results.

[Example of the Hardware Configuration of the Information Processing Apparatus 100]

Figure 3:
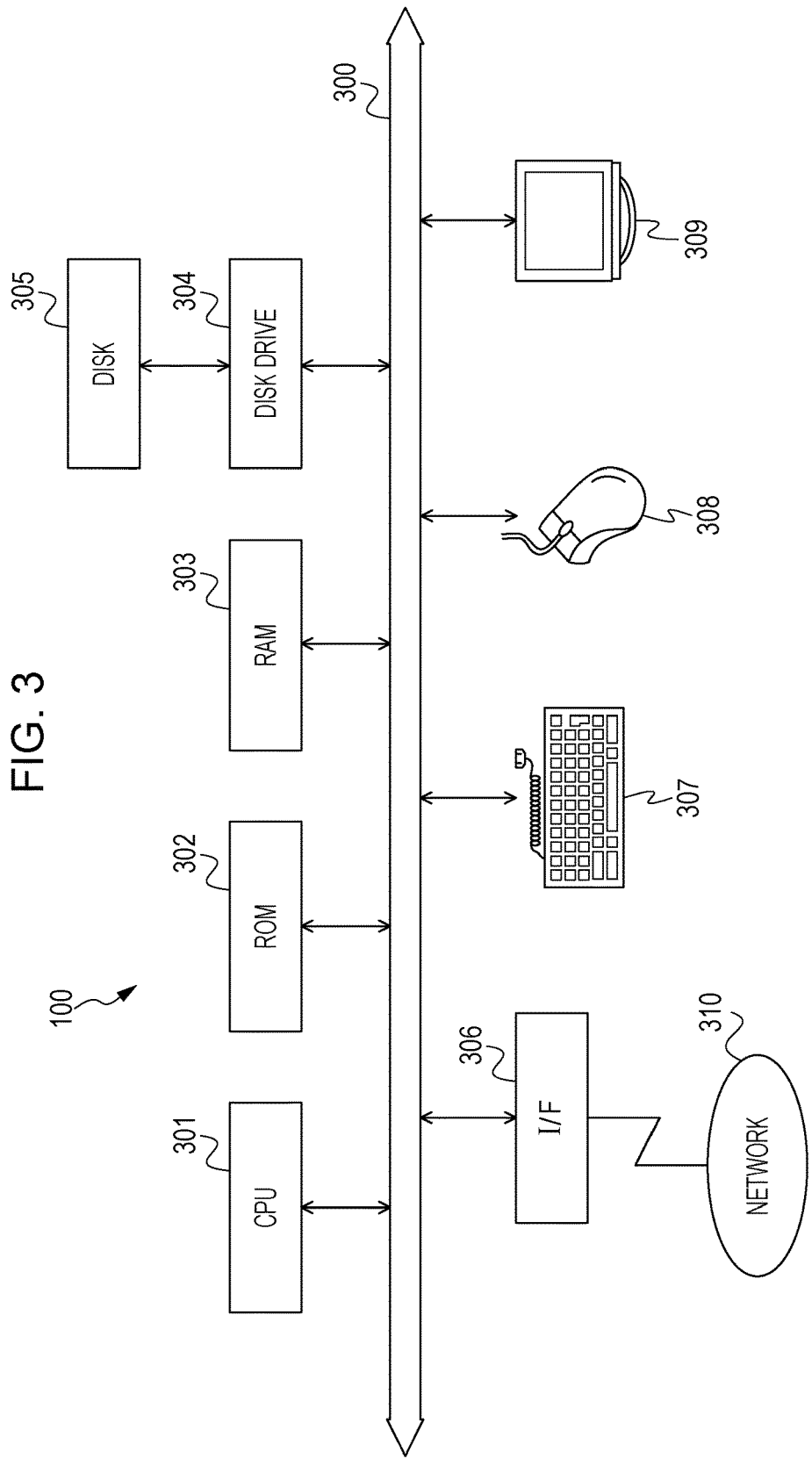
FIG. 3 is a diagram illustrating an example of the hardware configuration of the information processing apparatus.

FIG. 3 is a diagram illustrating an example of the hardware configuration of the information processing apparatus. The information processing apparatus 100 has a central processing unit (CPU) 301, a read-only memory (ROM) 302, a random access memory (RAM) 303, a disk drive 304, and a disk 305. The information processing apparatus 100 further has an interface (I/F) 306, a keyboard 307, a mouse 308 and a display 309. The CPU 301, the ROM 302, the RAM 303, the disk drive 304, the I/F 306, the keyboard 307, the mouse 308, and the display 309 are connected to one another via a bus 300.

The CPU 301 performs overall control of the information processing apparatus 100. The ROM 302 stores programs such as a boot program. The RAM 303 is used as a work area of the CPU 301. The disk drive 304 controls, as controlled by the CPU 301, reading and writing of data from and to the disk 305. The disk 305 stores data written as controlled by the disk drive 304. Examples of the disk 305 include a magnetic disk and an optical disk.

The I/F 306 is connected to a network 310, such as a local area network (LAN), a wide area network (WAN), or the Internet, via a communications line and connected to another device via the network 310. The I/F 306 serves as an interface between the network 310 and the information processing apparatus 100, and controls input and output of data from and to an external device. For example, a modem or a LAN adapter is usable as the I/F 306.

The keyboard 307 and the mouse 308 are interfaces used to input various types of data. The display 309 is an interface for outputting data as instructed by the CPU 301.

Although not illustrated in FIG. 3, an input device that acquires an image or video from a camera or an input device that acquires voice from a microphone may be provided in the information processing apparatus 100. In addition, although not illustrated in FIG. 3, an output device such as a printer may be provided in the information processing apparatus 100.

Although a PC is assumed as the hardware configuration of the information processing apparatus 100 in the present embodiment, the embodiment is not limited to this, and may be a server or the like. When the information processing apparatus 100 is a server, the display 309 or the like included in a user-operable client terminal device may be connected to the information processing apparatus 100 via the network 310.

Although not illustrated in FIG. 3, a remote desktop system may be used as a system including the information processing apparatus 100. For example, with the information processing apparatus 100 being a server, the information processing apparatus 100 may generate image information containing an image of the electromagnetic field distribution, and transmit the thus-generated image information to the user-operable client terminal device, which then displays the image in the image information on a display or the like.

[Example of the Functional Configuration of the Information Processing Apparatus 100]

Figure 4:
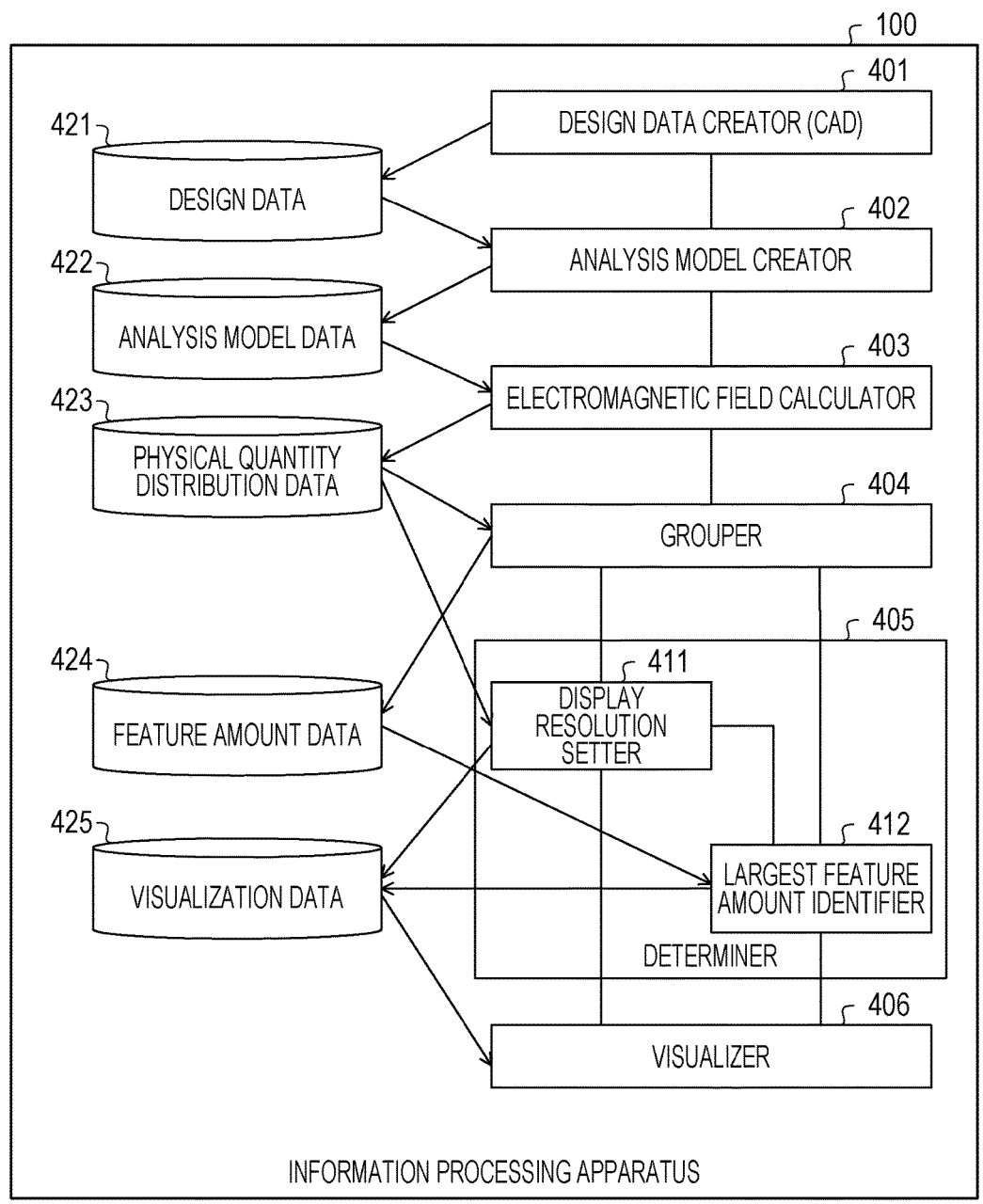
FIG. 4 is a block diagram illustrating an example of the functional configuration of the information processing apparatus.

FIG. 4 is a block diagram illustrating an example of the functional configuration of the information processing apparatus. The information processing apparatus 100 has a design data creator 401, an analysis model creator 402, an electromagnetic field calculator 403, a grouper 404, a determiner 405, and a visualizer 406. Processes performed by these controllers, namely the design data creator 401 to the visualizer 406 are, for example, coded in programs stored in a storage device accessible to the CPU 301, such as the ROM 302, the RAM 303, or the disk 305. To implement a process of a certain controller, the CPU 301 reads a certain program from the storage device and executes a process coded in the program. A process result obtained by the controller is, for example, stored in a storage device such as the RAM 303, the ROM 302, or the disk 305.

The design data creator 401 generates design data 421 representing an analysis target object by using computer-aided design (CAD). The design data 421 thus generated is stored in a storage device such as the RAM 303, the ROM 302, or the disk 305. In a case of a three-dimensional object for example, the design data 421 is a three-dimensional model representing the object with polygons. For example, when CAD is used to design a three-dimensional assembly, the analysis target object is, for example, an assembly model formed by two or more parts. The object is an assembly model of, for example, an electronic device such as a semiconductor device, a PC, a tablet PC, a server, a personal digital assistant, or a smartphone, or a mechanical product such as an automobile or an electric home appliance, the assembly model being virtualized on a computer.

Next, the analysis model creator 402 generates analysis model data 422 representing, for example, an analysis model obtained by the analysis modeling of the object represented by the design data 421. The analysis model data 422 thus generated is stored in a storage device such as the RAM 303, the ROM 302, or the disk 305. The analysis data includes information on the shape of the object. The analysis model data 422 generated by the analysis model creator 402 represents, for example, an analysis model created by the grid segmentation of an analysis target space including the object. For example, the analysis model data 422 includes information on the shape of the object. The analysis model represents the analysis target space using grid points or the like, for example. The grid points are, for example, vertexes of grids of the analysis target space.

Figure 5:
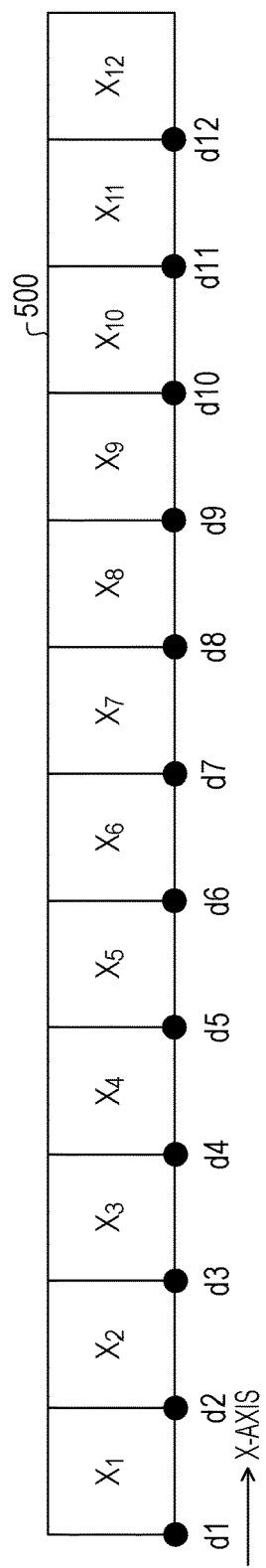
FIG. 5 is a diagram illustrating an example of grid points defined in a one-dimensional space.

FIG. 5 is a diagram illustrating an example of grid points in a one-dimensional space. In this example, a one-dimensional analyzed space 500 extending along the X-axis is divided into sections $X_1$ to $X_{12}$. Calculation points for analysis virtually provided to the sections $X_1$ to $X_{12}$ are grid points. The position of each grid point is not particularly limited. The grid point may be provided at the edge of a section, or at the middle position within the section. The sections $X_1$ to $X_{12}$ all have the same width in the example in FIG. 5, but may have different widths from one another. The width of each section may be called a grid-point width herein. The grid-point width is a distance between grid points.

The analysis model data 422 includes, for example, information on the associations between the grid points in the one-dimensional, numerical analysis target space 500 and their positions, although FIG. 4 does not illustrate such information. In the example in FIG. 5, grid points d1 to d12 are provided at equal intervals in the order mentioned, and thus the positional relations of the grid points is determinable. For instance, the neighboring points of the grid point d2 are the grid point d1 and the grid point d3.

Referring back to FIG. 4, the electromagnetic field calculator 403 analyzes an electromagnetic field at each grid point by, for example, analyzing the analysis model and electromagnetic field interaction based on the analysis model data 422. The electromagnetic field calculator 403 thereby obtains physical-quantity distribution data 423. The physical-quantity distribution data 423 thus generated is stored in a storage device such as the ROM 302, the RAM 303, or the disk 305.

FIG. 6 is a diagram illustrating an example of the physical-quantity distribution data. For example, the physical-quantity distribution data 423 includes, for each grid point, a characteristic value, a direction, and the amount of change in the characteristic value. In this example, there are grid points d1 to d12. In a case of electromagnetic field analysis, the characteristic value is electromagnetic field strength [dB]. The characteristic value may be represented by S herein. The direction is, for example, the direction of an electric field or the charge moving direction. The direction may be represented by D herein. The direction of an electric field or the charge moving direction is, for example, either "+" or "−". The amount of change in the characteristic value is, for example, the amount of change in the electromagnetic field strength, or specifically, the amount of temporal change in the electromagnetic field strength. The amount of change in the characteristic value may be represented by Δ, for example.

The characteristic value and the amount of change in the characteristic value may be, for example, quantized values. For example, the grouper 404 quantizes the physical quantities at each grid point. The grouper 404 may quantize, for example, the characteristic value and the amount of change in the characteristic value at each grid point, and set the quantized characteristic value and the quantized amount of change in the characteristic value in the physical-quantity distribution data 423. The quantization method is not particularly limited. The quantized values may be rounded off, rounded down, or rounded up so as to express a designated number of decimal places. For example, if the characteristic value is between 0 to 0.4, the characteristic value may be expressed as 0 no matter what the value is after the decimal point, and if the characteristic value is between 0.1 to 0.9, the characteristic value may be expressed as 1.

Referring back to FIG. 4, the grouper 404 groups the grid points into groups of neighboring grid points having the same physical quantity. The grouper 404 thus generates feature quantity data 424. A variable for storing the group number of a grid point di is also called a feature amount herein.

A characteristic value, a direction, and the amount of change in the characteristic value are handled as a physical quantity. Thus, based on the physical-quantity distribution data 423, the grouper 404 groups the grid points into groups of neighboring grid points having the same characteristic value, the same direction, and the same amount of change in the characteristic value. In the following detailed example, the grouper 404 assigns grid points whose characteristic values are zero to the same group even if they do not neighbor each other. However, the embodiment is not limited to this. Grid points which do not neighbor each other may be grouped into different groups even when their characteristic values are zero.

FIG. 7 is a diagram illustrating an example of grouping. The grouper 404 assigns the grid point d1 and the grid point d12 to the same group g0 because their characteristic values are zero. Herein, a variable for storing the group number of the grid point di is expressed as a feature amount Gi. A feature amount G1 is a group g0.

The grouper 404 assigns the grid points d1 to d4 to different groups because they have different characteristic values in this example. For example, the grouper 404 sets a feature amount G2 for the grid point d2 to a group g1, a feature amount G3 for the grid point d3 to a group g2, and a feature amount G4 for the grid point d4 to a group g3.

For example, the grouper 404 assigns the grid points d4 to d6 to the same group because they are neighboring grid points having the same characteristic value, direction, and amount of change in the characteristic value. Specifically, the grouper 404 sets feature amounts G4 to G6 for the grid points d4 to d6 to a group g3.

In this example, the grid point d7 agrees with the grid points d4 to d6 in the characteristic value and direction, but disagrees therewith in the amount of change in the characteristic value. Thus, the grouper 404 assigns the grid point d7 to a group different from that of the grid points d4 to d6.

Specifically, the grouper 404 sets a feature amount G7 for the grid point d7 to a group g4. Since the grid point d8 disagrees with the grid point d7 in the characteristic value, the grouper 404 assigns the grid point d8 to a group different from that of the grid point d7. Specifically, the grouper 404 sets a feature amount G8 for the grid point d8 to a group g5.

The grid point d9 agrees with the grid point d8 in the characteristic value but disagrees therewith in the direction and the amount of change in the characteristic value. Thus, for example, the grouper 404 assigns the grid point d9 to a group different from that of the grid point d8. The grid points d9 and d10 have the same characteristic value, direction, and amount of change in the characteristic value. Thus, in this example, the grouper 404 assigns the grid points d9 and d10 to the same group. In this example, the grouper 404 sets feature amounts G9 and G10 for the grid points d9 and d10 to a group g6.

Since the grid point d11 disagrees with the grid point d10 in the characteristic value in this example, the grouper 404 assigns the grid points d10 and d11 to different groups. Specifically, the grouper 404 sets a feature amount G11 for the grid point d11 to a group g7.

FIG. 8 is a diagram illustrating an example of the feature amount data. In this example, j is 0 to 7. As for the group g1 in this example, the characteristic value S is "5", the direction D is "+", the amount of change in the characteristic value Δ is "1", and the number of grid points is "1". As for the group g2 in this example, the characteristic value S is "3", the direction D is "+", the amount of change in the characteristic value Δ is "2", and the number of grid points is "1".

As for the group g3 in this example, the characteristic value S is "1", the direction D is "+", the amount of change in the characteristic value Δ is "−2", and the number of grid points is "3". As for the group g4 in this example, the characteristic value S is "1", the direction D is "+", the amount of change in the characteristic value Δ is "−1", and the number of grid points is "1". As for the group g5 in this example, the characteristic value S is "3", the direction D is "−", the amount of change in the characteristic value Δ is "−1", and the number of grid points is "1".

As for the group g6 in this example, the characteristic value S is "3", the direction D is "+", the amount of change in the characteristic value Δ is "1", and the number of grid points is "2". As for the group g7 in this example, the characteristic value S is "1", the direction D is "+", the amount of change in the characteristic value Δ is "0", and the number of grid points is "1".

Referring back to FIG. 4, for each of the pixels, the determiner 405 extracts, from the groups formed by the grouper 404, groups which include at least one of the grid points corresponding to the pixel, identifies a group which includes the largest number of grid points among the extracted groups, and determines that the physical quantity at a grid point included in the identified group is the physical quantity for the pixel. The pixels are, for example, pixels in the display 309 of the visualization device, and are fewer than the total grid points. Thus, more than one grid point corresponds to one pixel.

The determiner 405 has, for example, a display resolution setter 411 and a largest feature amount identifier 412. First, the display resolution setter 411 associates each pixel with corresponding grid points. Next, the largest feature amount identifier 412 extracts groups which include at least one of the grid points corresponding to the pixel, identifies a group which includes the largest number of grid points among the extracted groups, and determines that the physical quantity at a grid point included in the identified group is the physical quantity for the pixel.

The display resolution setter 411 acquires, for example, the total number of pixels as a display resolution defined by the visualization device. In the following example, the total number of pixels is three, and these pixels are arranged one-dimensionally.

FIG. 9 is a diagram illustrating an example of association of each pixel with grid points. In this example, grid points d1 to d12 each have a grid-point width of 10. The display resolution setter 411 determines the grid-point width per pixel by, for example, dividing the total of the grid-point widths of the grid points d1 to d12 by the total number of pixels.

In this example, the total of the grid-point widths of the grid points d1 to d12 is 12×10=120. Hence, the grid-point width per pixel is 120/3=40. Since the total of the grid-point widths of the grid points d1 to d4 is 40 in this example, the display resolution setter 411 associates a pixel Px1 with the grid points d1 to d4. Since the total of the grid-point widths of the grid points d5 to d8 is 40 in this example, the display resolution setter 411 associates a pixel Px2 with the grid points d5 to d8. Since the total of the grid-point widths of the grid points d9 to d12 is 40 in this example, the display resolution setter 411 associates a pixel Px3 with the grid points d9 to d12.

For example, the largest feature amount identifier 412 extracts, for each of pixels, groups which include at least one of the grid points corresponding to the pixel, and identifies a group which includes the largest number of grid points among the extracted groups. Then, for example, the largest feature amount identifier 412 determines that the characteristic value at a grid point included in the group including the largest number of grid points is the characteristic value to be visualized by the pixel. The determination result is stored in a storage device such as the ROM 302, the RAM 303, or the disk 305, as visualization data 425.

FIG. 10 is a diagram illustrating an example of how a characteristic value is determined for each pixel. In this example, the grid points d1 to d4 correspond to the pixel p1. The grid point d1 belongs to the group g0, the grid point d2 belongs to the group g1, the grid point d3 belongs to the group g2, and the grid point d4 belongs to the group g3. The largest feature amount identifier 412 identifies the group g3 as a group including the largest number of grid points among the groups g0 to g3. A group including the largest number of grid points is also called the largest feature amount herein. The largest feature amount identifier 412 determines that the characteristic value of the grid point d3 belonging to the group g3 is the characteristic value for the pixel p1. In this example, the characteristic value for the pixel p1 is "1".

Further, the grid points d5 to d8 correspond to the pixel p2. The grid points d5 and d6 belong to the group g3, the grid point d7 belongs to the group g4, and the grid point d8 belongs to the group g5. The largest feature amount identifier 412 identifies the group g3 as a group including the largest number of grid points among the groups g3 to g5. The largest feature amount identifier 412 then determines that the characteristic value at the grid point d3 belonging to the group g3 is the characteristic value for the pixel p2. In this example, the characteristic value for the pixel p2 is "1".

Further, the grid points d9 to d12 correspond to the pixel p3. The grid points d9 and d10 belong to the group g6, the grid point d11 belongs to the group g7, and the grid point d12 belongs to the group g0. A group including the largest number of grid points among the groups g6, g7, and g0 is both the group g6 and the group g0.

When the largest feature amount is not uniquely determined as in the above example, the largest feature amount identifier 412 selects, as the largest feature amount, a group whose grid points that correspond to the pixel have a total grid-point width which accounts for the largest percentage of the overall grid-point width of the grid points corresponding to the pixel. The grid-point width of a grid point is, for example, the width of an analyzed area or section in a target space defined by the grid point. The grid points d9 to d12 all have a grid-point width of 10.

The total of the grid-point widths of the grid points d9 and d10 belonging to the group g6 accounts for 50% of the overall grid-point width of the grid points corresponding to the pixel p3. The grid-point width of the grid point d11 belonging to the group g7 accounts for 25% of the overall grid-point width of the grid points corresponding to the pixel p3. The grid-point width of the grid point d12 belonging to the group g0 accounts for 25% of the overall grid-point width of the grid points corresponding to the pixel p3. Hence, the largest feature amount identifier 412 selects the group g6 as the largest feature amount. Thus, the largest feature amount identifier 412 determines that the characteristic value at the grid points d9 and d10 belonging to the group g6 is the characteristic value for the pixel p3. In this example, the characteristic value for the pixel p3 is "3".

Alternatively, the largest feature amount identifier 412 may be configured not to select the group g0, which is a group of grid points whose characteristic value is zero, as the largest feature amount.

Figure 11:
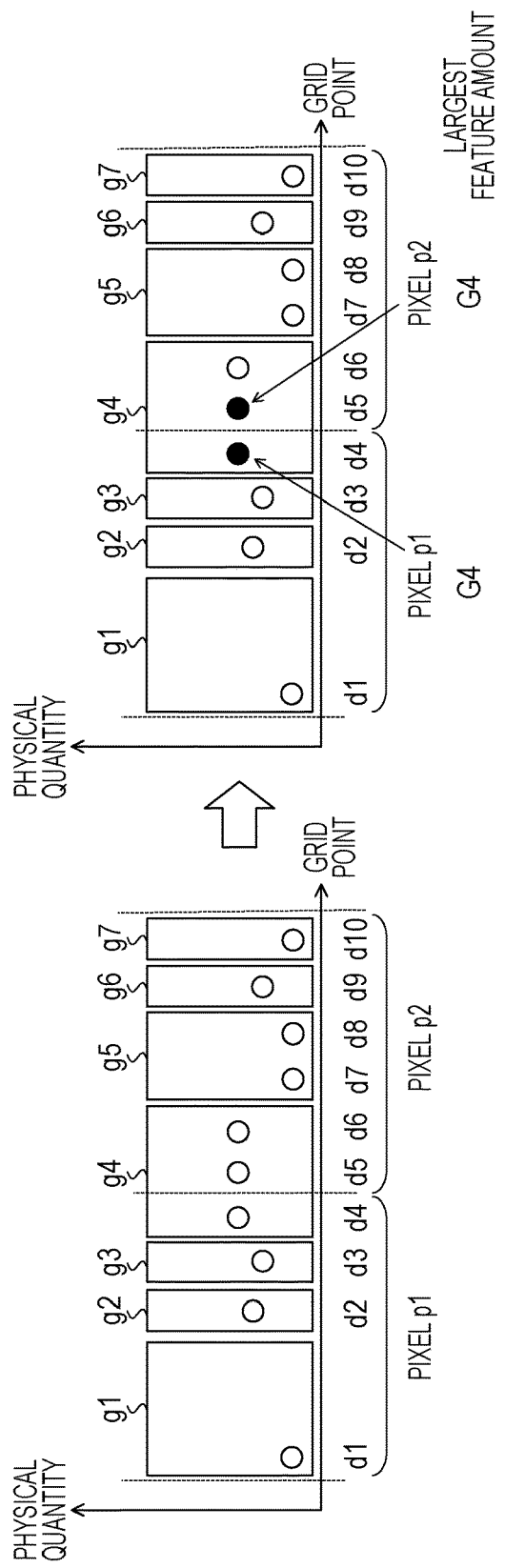
FIG. 11 is a diagram illustrating grid-point width and the largest feature amount.

FIG. 11 is a diagram illustrating grid-point widths and the largest feature amounts when the grid-point widths are not the same. In this example, the grid-point width of the grid point d1 accounts for the largest percentage of the overall grid-point width of the grid points corresponding to the pixel p1. However, the largest feature amount identifier 412 identifies the group g4, not the group g1 including the grid point d1, as the largest feature amount.

The more the grid points, the higher the calculation accuracy, but the longer the calculation time. For this reason, grid points may be decreased in such a case. In the example in FIG. 11, the grid-point width of the grid point d1 is three times larger than those of the grid points d2 to d10, and therefore the calculation accuracy for the section including the grid point d1 is lower than the rest. Thus, the group g4, which has more grid points than the group g1 and therefore has higher accuracy than the group g1, is selected over the group g1 as the largest feature amount, so that a steady physical quantity may be selected.

Referring back to FIG. 4, for each of the pixels, the visualizer 406 visualizes the characteristic value corresponding to the pixel.

Figure 12:
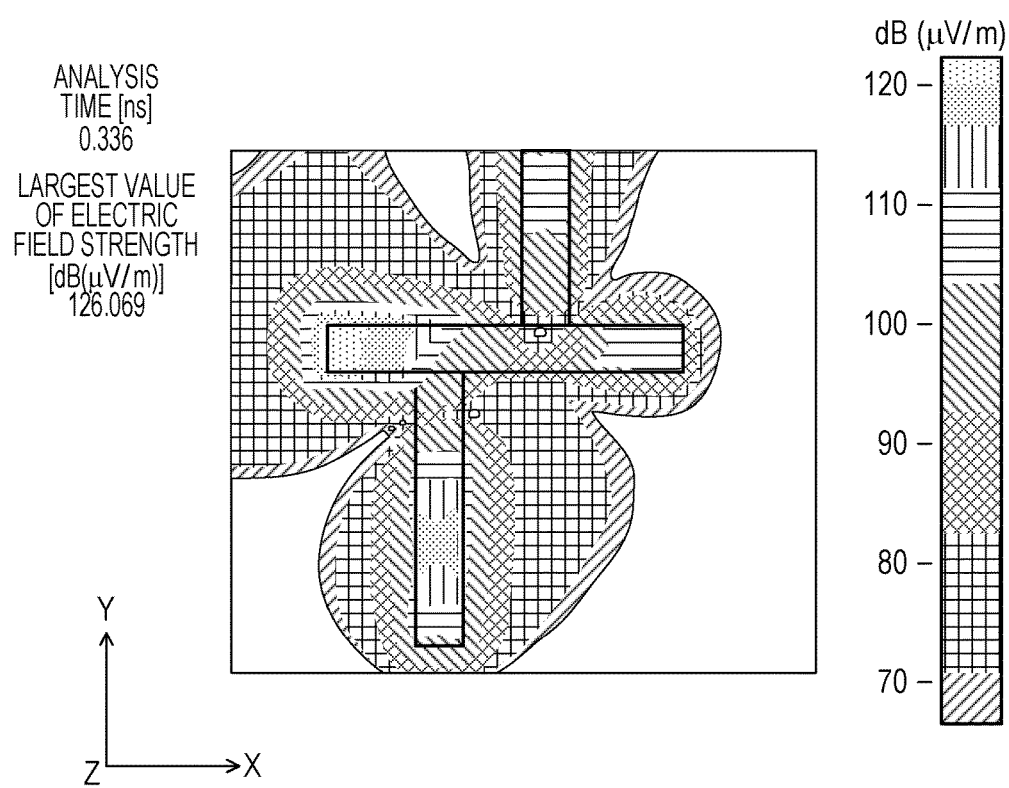
FIG. 12 is a diagram illustrating an example of visualization of a characteristic value.

FIG. 12 is a diagram illustrating how characteristic values are visualized. FIG. 12 depicts an example of visualizing an electromagnetic field distribution based on a display pattern determined according to the electromagnetic field strength for each pixel. In the example in FIG. 12, the analysis time is 0.336 ns, and the distribution of electromagnetic field strengths depicted is taken at any time point during this analysis time. The maximum electromagnetic field strength is 126 dB in the example in FIG. 12.

The method of the visualization is not particularly limited. For example, the visualizer 406 may perform visualization by classifying the characteristic values for the respective pixels by color according to the characteristic values. Alternatively, the visualizer 406 may perform visualization by changing the heights of characteristic values for the respective pixels according to the characteristic values.

FIG. 13 is a diagram illustrating an example of the associations between pixels and the largest characteristic values. FIG. 13 depicts an example where, simply, the largest one of the characteristic values of the grid points corresponding to a certain pixel is selected as the characteristic value for the pixel. Specifically, "5" is selected as the characteristic value for the pixel p1, "3" is chosen as the characteristic value for the pixel p2, and "3" is selected as the characteristic value for the pixel p3. Thus, for the pixels p2 and p3, the characteristic value "1" distributed from the grid points d4 to d7 is not visualized, but instead, the characteristic values "5" and "3", which are largest values, are visualized.

FIG. 13 also depicts, in the row named "CHARACTERISTIC VALUE OF LARGEST FEATURE AMOUNT", an example according to the present embodiment where, for each pixel, the characteristic value of the largest feature amount is selected as the characteristic value for the pixel. Specifically, "1" is selected as the characteristic value for the pixel p1, "1" is selected as the characteristic value for the pixel p2, and "3" is selected as the characteristic value for the pixel p3.

When the largest characteristic value is selected as a characteristic value for a pixel, a locally-increased characteristic value at any of grid points corresponding to the pixel or of grid points near the pixel may be selected as the characteristic value for the pixel. In this respect, when the characteristic value of the largest feature amount is selected as in the present embodiment, a steady characteristic value may be selected as the characteristic value for the pixel from the characteristic values at grid points corresponding to the pixel or grid points near the pixel.

This allows removal of local noise, enabling visualization of a steady distribution of physical quantities. Such noise removal may facilitate the study of analysis results.

Although the analysis target space is a one-dimensional space in the example described above, the embodiment is not limited to this. The analysis target space may be a two- or three-dimensional space. For example, when the analysis target space is a three-dimensional space, the information processing apparatus 100 may divide the three-dimensional space into one-dimensional elements defined on the X axis, the Y-axis, and the Z-axis, and perform the grouping on each of the one-dimensional elements. In this way, the grouping may be performed on a two- or three-dimensional space in the same manner as when the analysis target space is a one-dimensional space.

[Example Procedures of Processing Performed by the Information Processing Apparatus 100]

Figure 14:
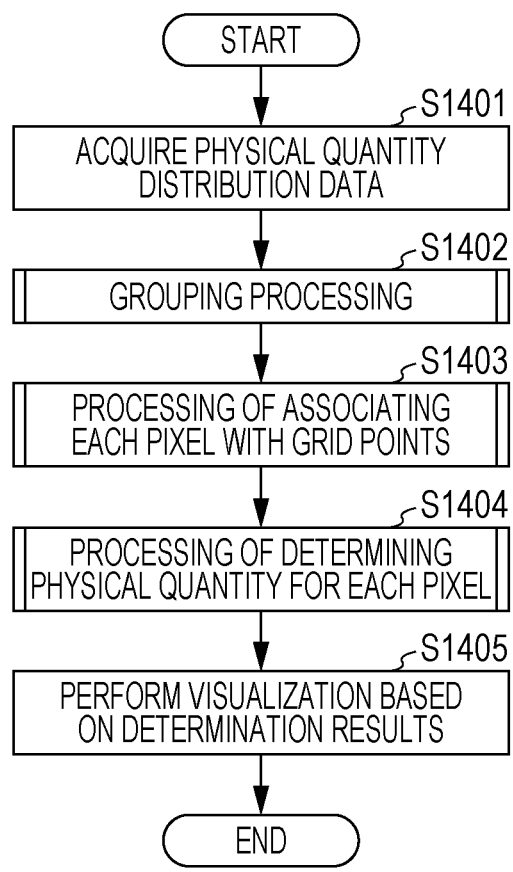
FIG. 14 is a flowchart illustrating an example of processes performed by the information processing apparatus.

FIG. 14 is a flowchart illustrating an example of processes performed by the information processing apparatus. First, the information processing apparatus 100 acquires, for example, the physical-quantity distribution data 423 (Step S1401). Next, the information processing apparatus 100 performs, for example, a grouping process (Step S1402). Then, the information processing apparatus 100 performs, for example, a process of associating each pixel with grid points (Step S1403).

Next, the information processing apparatus 100 performs, for example, a process of determining the physical quantity for each pixel (Step S1404). Thereby, the physical quantity to be visualized by each pixel is determined. The information processing apparatus 100 then performs, for example, visualization based on the determination results (Step S1405). The processing thus ends.

Figure 15:
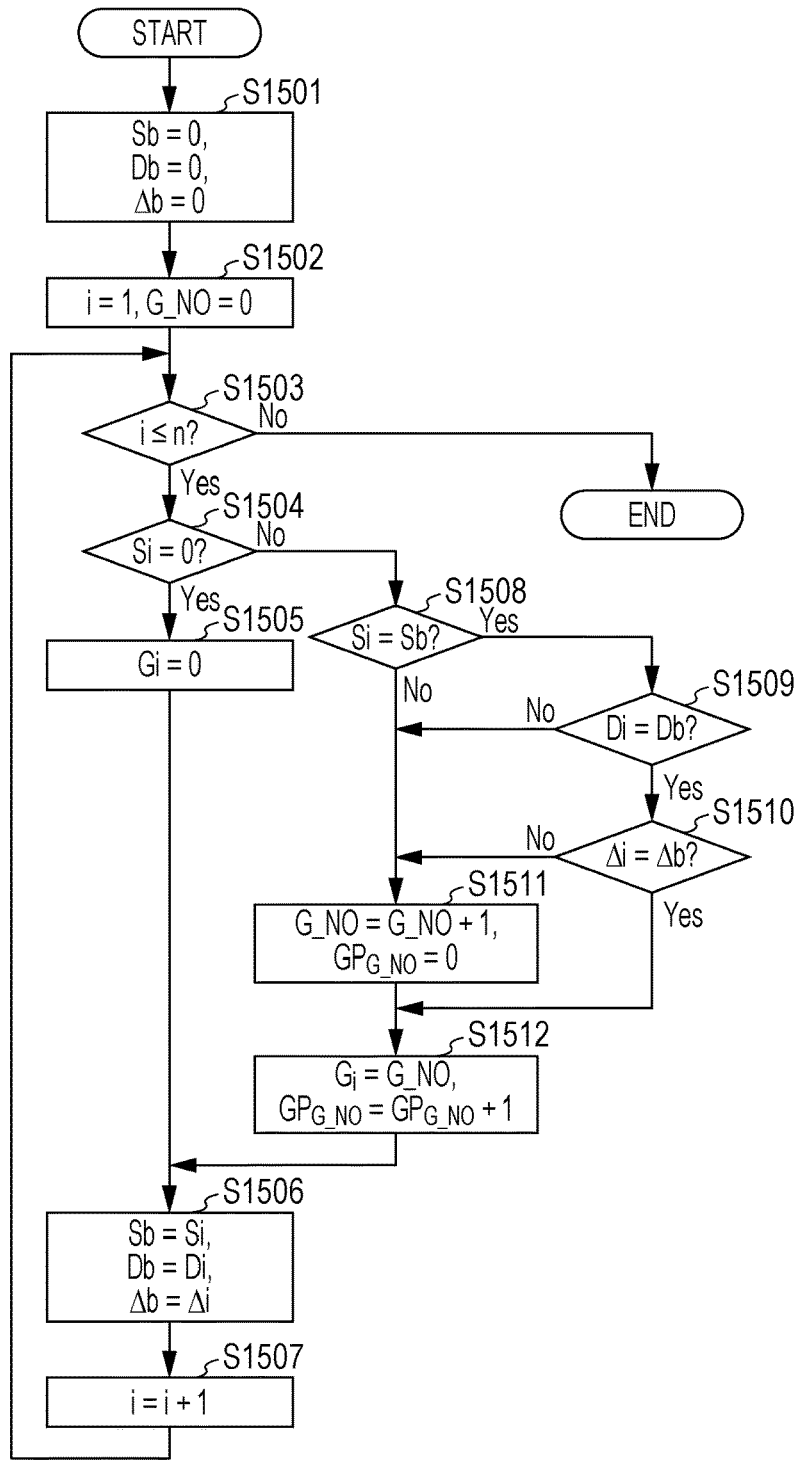
FIG. 15 is a flowchart illustrating the grouping process in FIG. 14 in detail.

FIG. 15 is a flowchart illustrating the grouping process in FIG. 14 in detail. First, the information processing apparatus 100 sets the following values: Sb=0, Db=0, and Δb=0 (Step S1501). Next, the information processing apparatus 100 sets the following values: i=1 and G_NO=0 (Step S1502). Then, the information processing apparatus 100 determines whether i≤n (Step S1503), where n is the number of grid points.

When determining that i≤n (YES in Step S1503), the information processing apparatus 100 determines whether the characteristic value Si at the grid point i is 0 (zero) (Step S1504). When determining that the characteristic value Si at the grid point i is 0 (YES in Step S1504), the information processing apparatus 100 sets the feature amount Gi for the grid point i to Gi=0 (Step S1505). For example, the feature amount Gi at the grid point i represents the number of the group to which the grid point i belongs. Thus, when the information processing apparatus 100 sets the feature amount Gi for the grid point i to Gi=0, the grid point i belongs to a group g0. In this way, Steps S1504 and S1505 assign the grid point i to the group g0 when the characteristic value Si for the grid point i is 0.

The information processing apparatus 100 then, for example, sets the following values: Sb=Si, Db=Di, and Δb=Δi (Step S1506). Next, the information processing apparatus 100 increments i (i=i+1) (Step S1507), and proceeds back to Step S1503.

When determining in Step S1504 that the characteristic value Si at the grid point i is not 0 (NO in Step S1504), the information processing apparatus 100 determines whether the characteristic value Si at the grid point i is a characteristic value Sb (Step S1508). The characteristic value Sb is the characteristic value at the previous grid point i−1. When determining that the characteristic value Si at the grid point i is not the characteristic value Sb (No in Step S1508), the information processing apparatus 100 proceeds to Step S1511. When determining that the characteristic value Si at the grid point i is the characteristic value Sb (Yes in Step S1508), the information processing apparatus 100 determines whether the direction Di at the grid point i is a direction Db (Step S1509). The direction Db is the direction at the previous grid point i−1.

When determining that the direction Di at the grid point i is not the direction Db (No in Step S1509), the information processing apparatus 100 proceeds to Step S1511. When determining that the direction Di at the grid point i is the direction Db (Yes in Step S1509), the information processing apparatus 100 proceeds to Step S1510. Next, the information processing apparatus 100 determines whether the amount of change Δi at the grind point i is an amount of change Δb (Step S1510).

When determining that the amount of change Δi at the grind point i is not the amount of change Δb (No in Step S1510), the information processing apparatus 100 proceeds to Step S1511. When determining that the amount of change Δi at the grind point i is the amount of change Δb (Yes in Step S1510), the information processing apparatus 100 proceeds to Step S1512.

When any of the result of Step S1508, Step S1509, and Step S1510 is No, the information processing apparatus 100 sets the following values: G_NO=G_NO+1 and $GP_{G\_NO}=0$ (Step S1511). Next, the information processing apparatus 100 sets the following values: Gi=G_NO and $GP_{G\_NO}=GP_{G\_NO}+1$ (Step S1512), and proceeds to Step S1506.

When determining in Step S1503 that i≤n does not hold true (No in Step S1503), the information processing apparatus 100 ends the grouping process.

Figure 16:
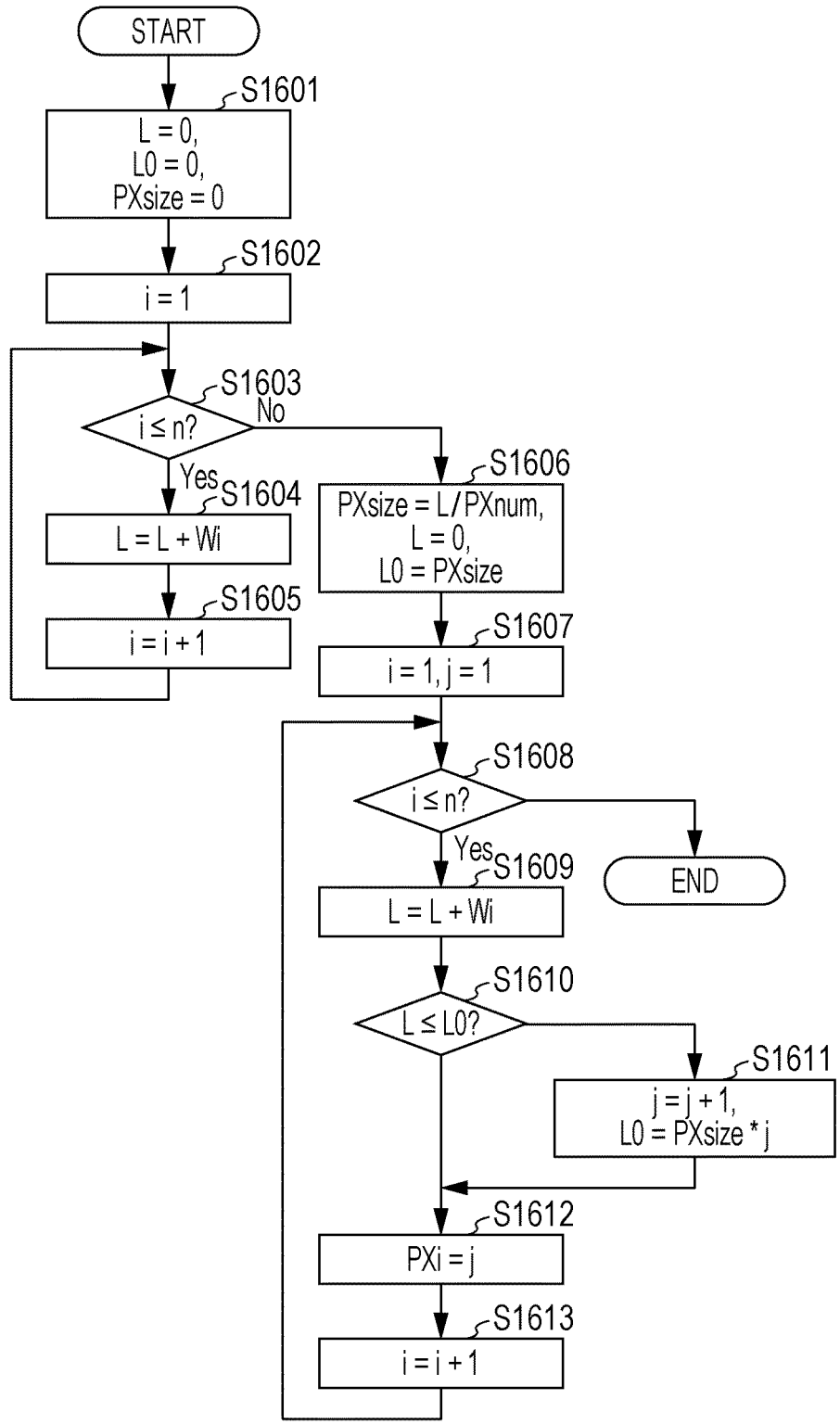
FIG. 16 is a flowchart illustrating the association process in FIG. 14 in detail.

FIG. 16 is a flowchart illustrating the association process in FIG. 14 in detail. First, the information processing apparatus 100 sets the following values: L=0, L0=0, and PXsize=0 (Step S1601). Next, the information processing apparatus 100 sets the following value: i=1 (Step S1602). Then, the information processing apparatus 100 determines whether i≤n (Step S1603), where n is the number of grid points. When determining that i≤n (Yes in Step S1603), the information processing apparatus 100 sets the following value: L=L+Wi (Step S1604). The information processing apparatus 100 then sets the following value: i=i+1 (Step S1605), and proceeds back to Step S1603. Steps S1603 to S1605 calculate the total width of sections defined by the grid points.

When determining that i≤n does not hold true (No in Step S1603), the information processing apparatus 100 sets the following values: PXsize=L/PXnum, L=0, and L0=PXsize (Step S1606). PXnum is the number of pixels, and PXsize is the distribution width of grid points per pixel.

Then, the information processing apparatus 100 sets the following values: i=1 and j=1 (Step S1607). The information processing apparatus 100 determines whether i≤n (Step S1608). When determining that i≤n (Yes in Step S1608), the information processing apparatus 100 sets the following value: L=L+Wi (Step S1609). Then, the information processing apparatus 100 determines whether L≤L0 (Step S1610).

When determining that L≤L0 does not hold true (No in Step S1610), the information processing apparatus 100 sets the following values: j=j+1 and L0=PXsize×j (Step S1611), and proceeds to Step S1612. When determining that L≤L0 (Yes in Step S1610), the information processing apparatus 100 sets the following value: PXi=j (Step S1612). Next, the information processing apparatus 100 sets the following value: i=i+1 (Step S1613), and proceeds back to Step S1608.

When determining in Step S1608 that i≤n does not hold true (No in Step S1608), the information processing apparatus 100 ends the association process.

Figure 17:
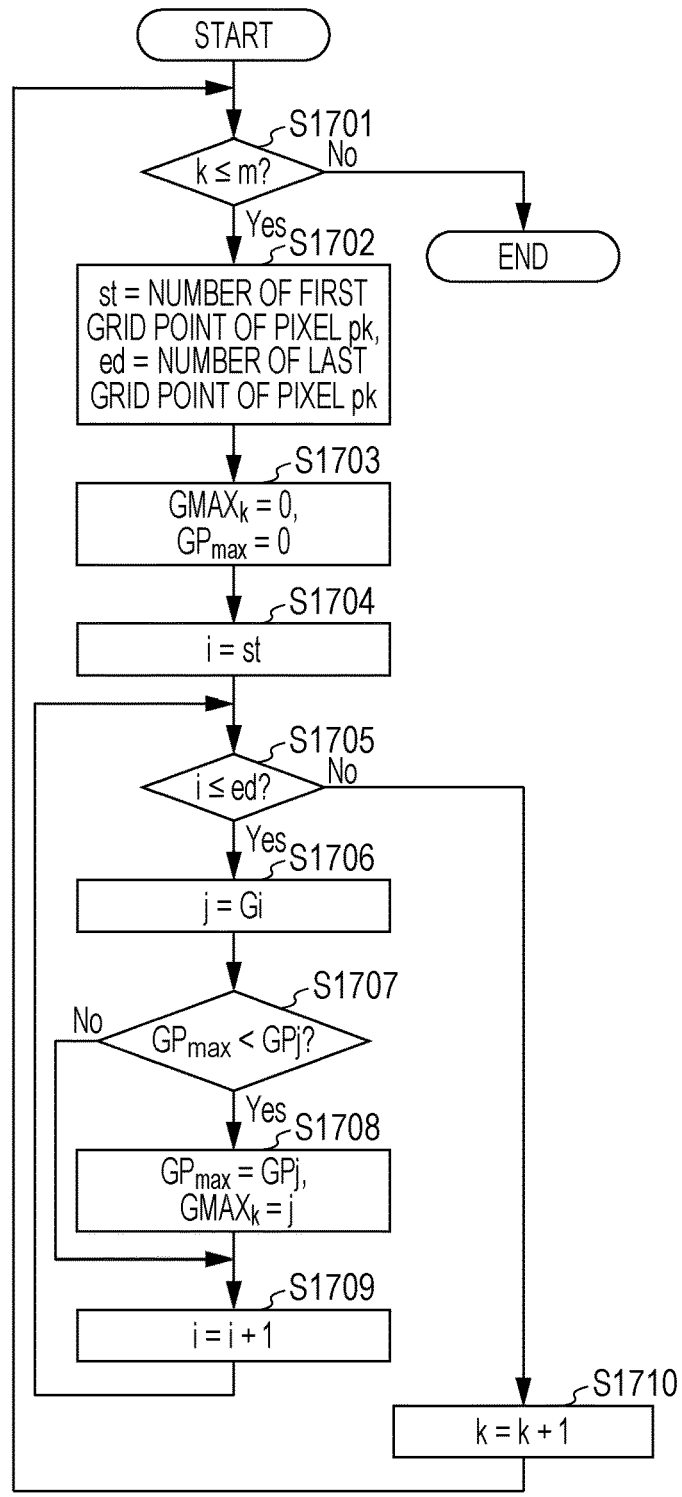
FIG. 17 is a flowchart illustrating the determination process in FIG. 14 in detail.

FIG. 17 is a flowchart illustrating the determination processing in FIG. 14 in detail. First, the information processing apparatus 100 determines whether k≤m (Step S1701), where m is the total number of pixels. When determining that k≤m (Yes in Step S1701), the information processing apparatus 100 sets the following values: st=the number of the first grid point for the pixel pk, and ed=the number of the last grid point for the pixel pk (Step S1702).

The information processing apparatus 100 sets the following values: $GMAX_k=0$ and $GP_{max}=0$ (Step S1703). The information processing apparatus 100 sets the following value: i=st (Step S1704). Next, the information processing apparatus 100 determines whether i≤ed (Step S1705). When determining that i≤ed (Yes in Step S1705), the information processing apparatus 100 sets the following value: j=Gi (Step S1706). Then, the information processing apparatus 100 determines whether $GP_{max}<GPj$ (Step S1707).

When determining that $GP_{max}<GPj$ (Yes in Step S1707), the information processing apparatus 100 sets the following values: $GP_{max}=GPj$ and $GMAX_k=j$ (Step S1708). Next, the information processing apparatus 100 sets the following value: i=i+1 (Step S1709), and proceeds back to Step S1705. When determining in Step S1707 that $GP_{max}<GPj$ does not hold true (No in Step S1707), the information processing apparatus 100 proceeds to Step S1709.

When determining in Step S1705 that i≤ed does not hold true (No in Step S1705), the information processing apparatus 100 sets the following value: k=k+1 (Step S1710), and proceeds back to Step S1701.

When determining in Step S1701 that k≤m does not hold true (No in Step S1701), the information processing apparatus 100 ends the determination process.

As described above, the information processing apparatus 100 forms groups of neighboring grid points having the same physical quantities. Then, for each visualization pixel, the information processing apparatus 100 extracts groups that include at least one of the grid points corresponding to the pixel, identifies a group which includes the largest number of grid points among the extracted groups, and determines that the physical quantity at the grid points of the identified group is the physical quantity for the pixel. As a result, removal of local noise is achieved to provide visualization of a steady distribution of physical quantities. This allows the spatial distribution form of the distribution of physical quantities not to miss a part, and provides assistance in making a correct judgment in the study of the analysis results.

In a case of electromagnetic field analysis, electromagnetic field strength is used as a physical quantity. The information processing apparatus 100 removes local noise so that a steady distribution of electromagnetic field strengths may be obtained. For example, display of such a steady distribution of electromagnetic field strength may facilitate determination of design conditions related to the EMC of an electronic device. Display of a steady distribution of electromagnetic field strengths also facilitates smooth conduct of investing the cause of, and considers measures against, for example, electromagnetic interference (EMI) radiation noise attributable to steady current distribution.

The physical quantities at a certain time point include electromagnetic field strength, a charge moving direction, and the difference between the electromagnetic field strength at the certain time point and electromagnetic field strength at the previous time point (electromagnetic field strength difference value). The information processing apparatus 100 assigns grid points having the same electromagnetic field strength, the same charge moving direction, and the same electromagnetic field strength difference value to the same group. For example, when certain grid points agree in the electromagnetic field strength, but disagree in the electromagnetic field strength difference value, one of them may be noise. When grid points are grouped according to accurately-distinguished characteristics of the electromagnetic field distribution as described above, precise removal of local noise may be achieved.

Moreover, the information processing apparatus 100 quantizes the physical quantities at grid points, and then groups the grid points based on the quantized physical quantities. This allows grid points with the same physical quantities to be assigned to the same group, which enables discrimination of a local physical quantity from a steady physical quantity.

There may be a case where a group including the largest number of grid points is not uniquely determined because more than one group has the largest number of grid points. In such a case, the information processing apparatus 100 selects, from the more than one group, a group whose grid points that correspond to the target pixel have a total grid-point width which accounts for the largest percentage of the overall grid-point width of all the grid points corresponding to the target pixel. Then, the information processing apparatus 100 determines that the physical quantity at the grid points belonging to the group thus selected is the physical quantity for the target pixel.

The physical quantity distribution calculation method described in the present embodiment may be implemented when a computer such as a personal computer or a work station executes a prepared physical quantity distribution calculation program. The physical quantity distribution calculation program is recorded in a computer-readable recording medium, such as a magnetic disk, an optical disk, or a universal serial bus (USB) flash memory, and is executed when read from the recording medium. The physical quantity distribution calculation program may be distributed via the network 310 such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory, computer-readable recording medium storing a physical quantity distribution calculation program to be executed by a computer that causes a display to visualize a physical quantity distribution in a target space for numerical analysis, the program causing the computer to perform the processes of:

based on positional information on a plurality of grid points defined in the target space and physical quantities obtained respectively at the plurality of grid points by the numerical analysis, grouping the plurality of grid points into groups of neighboring grid points having the same physical quantity;

determining the physical quantity to be visualized by each of a plurality of pixels of the visualization device which are used to visualize and display the physical quantities obtained respectively at the plurality of grid points by the numerical analysis and are fewer than the plurality of grid points, the determining process including extracting for the respective pixels, from the groups formed in the grouping process, at least one group including at least one of grid points corresponding to the pixel out of the plurality of grid points, identifying the group including the largest number of grid points among the extracted groups, and determining that the physical quantity at the grid points belonging to the identified group is the physical quantity to be visualized by the pixel, and displaying the pixels on the visualization device, wherein the numerical analysis is electromagnetic field analysis, and the physical quantities are electromagnetic field strength obtained by the electromagnetic field analysis, when the electromagnetic field analysis is performed at a first time point in a period of analysis time during which the numerical analysis is performed and at a second time point in the period of analysis time, the second time point being before the first time point in the period of analysis time, information that contains the physical quantities obtained respectively at the plurality of grid points at the first time point by the electromagnetic field analysis includes, for each of the plurality of grid points, electromagnetic field strength at the first time point, a charge moving direction at the first time point, and a difference value between the electromagnetic field strength at the first time point and electromagnetic field strength at the second time point, and in the grouping process, the program causes the computer to group the plurality of grid points into the groups of neighboring grid points having the same electromagnetic field strength, the same charge moving direction, and the same difference value, which are included in the information that contains the physical quantities.

2. The recording medium storing the physical quantity distribution calculation program according to claim 1, wherein the program causes the computer to quantize the physical quantities at the plurality of grid points, and in the grouping process, the program causes the computer to group the plurality of grid points into the groups of neighboring grid points having the same physical quantity, based on the positional information on the plurality of grid points and the quantized physical quantities at the plurality of grid points.

3. The recording medium storing the physical quantity distribution calculation program according to claim 1, wherein in the determining process, when more than one group is identified as the group including the largest number of grid points, the program causes the computer to select, from the more than one group, a group whose grid points that correspond to the pixel define, in the target space, an analysis section which accounts for the largest percentage of an overall analysis section defined in the target space by all the grid points corresponding to the pixel, and determine that the physical quantity at the grid points belonging to the selected group is the physical quantity to be visualized by the pixel.

4. A physical quantity distribution calculation method performed by a computer that causes a visualization device to visualize a physical quantity distribution in a target space for numerical analysis, the method comprising:

based on positional information on a plurality of grid points defined in the target space and physical quantities obtained respectively at the plurality of grid points by the numerical analysis, grouping the plurality of grid points into groups of neighboring grid points having the same physical quantity;

determining the physical quantity to be visualized by each of a plurality of pixels of the visualization device which are used to visualize and display the physical quantities obtained respectively at the plurality of grid points by the numerical analysis and are fewer than the plurality of grid points, the determining including extracting, from the groups formed in the grouping, at least one group including at least one of grid points corresponding to the pixel out of the plurality of grid points, identifying the group including the largest number of grid points among the extracted groups, and determining that the physical quantity at the grid points belonging to the identified group is the physical quantity to be visualized by the pixel, and displaying the pixels on the visualization device, wherein the numerical analysis is electromagnetic field analysis, and the physical quantities are electromagnetic field strength obtained by the electromagnetic field analysis, when the electromagnetic field analysis is performed at a first time point in a period of analysis time during which the numerical analysis is performed and at a second time point in the period of analysis time, the second time point being before the first time point in the period of analysis time, information that contains the physical quantities obtained respectively at the plurality of grid points at the first time point by the electromagnetic field analysis includes, for each of the plurality of grid points, electromagnetic field strength at the first time point, a charge moving direction at the first time point, and a difference value between the electromagnetic field strength at the first time point and electromagnetic field strength at the second time point, and in the grouping process, the program causes the computer to group the plurality of grid points into the groups of neighboring grid points having the same electromagnetic field strength, the same charge moving direction, and the same difference value, which are included in the information that contains the physical quantities.

5. An information processing apparatus that causes a display to visualize a physical quantity distribution in a target space for numerical analysis, the apparatus comprising:

a memory; and a processor coupled to the memory and configured to execute a process comprising:

based on positional information on a plurality of grid points defined in the target space and physical quantities obtained respectively at the plurality of grid points by the numerical analysis, grouping the plurality of grid points into groups of neighboring grid points having the same physical quantity;

determining the physical quantity to be visualized by each of a plurality of pixels of the display which are used to visualize and display the physical quantities obtained respectively at the plurality of grid points by the numerical analysis and are fewer than the plurality of grid points, the determining including extracting for the respective pixels, from the groups formed in the grouping, at least one group including at least one of grid points corresponding to the pixel out of the plurality of grid points, identifying the group including the largest number of grid points among the extracted groups, and determining that the physical quantity at the grid points belonging to the identified group is the physical quantity to be visualized by the pixel, and displaying the pixels on the visualization device, wherein the numerical analysis is electromagnetic field analysis, and the physical quantities are electromagnetic field strength obtained by the electromagnetic field analysis, when the electromagnetic field analysis is performed at a first time point in a period of analysis time during which the numerical analysis is performed and at a second time point in the period of analysis time, the second time point being before the first time point in the period of analysis time, information that contains the physical quantities obtained respectively at the plurality of grid points at the first time point by the electromagnetic field analysis includes, for each of the plurality of grid points, electromagnetic field strength at the first time point, a charge moving direction at the first time point, and a difference value between the electromagnetic field strength at the first time point and electromagnetic field strength at the second time point, in the grouping process, the program causes the computer to group the plurality of grid points into the groups of neighboring grid points having the same electromagnetic field strength, the same charge moving direction, and the same difference value, which are included in the information that contains the physical quantities.

* * * * *